(12) United States Patent
Bhuiyan et al.

(10) Patent No.: US 10,437,472 B2
(45) Date of Patent: Oct. 8, 2019

(54) STORAGE SYSTEM AND METHOD FOR DYNAMIC DUTY CYCLE CORRECTION

(71) Applicant: SanDisk Technologies LLC, Plano, TX (US)

(72) Inventors: Ekram Bhuiyan, San Jose, CA (US); Steve Chi, Cupertino, CA (US)

(73) Assignee: SanDisk Technologies LLC, Plano, TX (US)

( * ) Notice: Subject to any disclaimer, the term of this patent is extended or adjusted under 35 U.S.C. 154(b) by 457 days.

(21) Appl. No.: 15/188,669

(22) Filed: Jun. 21, 2016

(65) Prior Publication Data
US 2017/0364276 A1    Dec. 21, 2017

(51) Int. Cl.
| G06F 12/00 | (2006.01) |
| G06F 3/06 | (2006.01) |
| G11C 16/10 | (2006.01) |
| G11C 16/26 | (2006.01) |
| G11C 7/22 | (2006.01) |
| G11C 13/00 | (2006.01) |
| G11C 16/32 | (2006.01) |
| G11C 29/02 | (2006.01) |

(52) U.S. Cl.
CPC .......... *G06F 3/0605* (2013.01); *G06F 3/0634* (2013.01); *G06F 3/0653* (2013.01); *G06F 3/0659* (2013.01); *G06F 3/0679* (2013.01); *G11C 7/222* (2013.01); *G11C 13/0061* (2013.01); *G11C 16/10* (2013.01); *G11C 16/26* (2013.01); *G11C 16/32* (2013.01); *G11C 29/023* (2013.01); *G11C 29/028* (2013.01)

(58) Field of Classification Search
CPC ......... G11C 7/1066; G11C 7/222; G11C 7/10; G11C 7/22; G11C 8/18; G06F 3/0605; G06F 3/0634; G06F 3/0653; G06F 3/0659; G06F 3/0679
See application file for complete search history.

(56) References Cited

U.S. PATENT DOCUMENTS

| 2006/0152266 | A1* | 7/2006 | Han | G11C 7/22 327/175 |
| 2012/0250426 | A1* | 10/2012 | Huang | G11C 7/1066 365/189.07 |
| 2014/0112089 | A1* | 4/2014 | Tsang | G11C 8/18 365/233.1 |
| 2016/0104520 | A1* | 4/2016 | Kang | G11C 7/222 365/233.1 |
| 2017/0337952 | A1* | 11/2017 | Shi | G11C 7/10 |

* cited by examiner

Primary Examiner — John A Lane
(74) Attorney, Agent, or Firm — Foley & Lardner LLP

(57) ABSTRACT

A storage system and method for dynamic duty cycle correction are disclosed. In one embodiment, a controller of a storage system provides a clock signal to the memory, receives the clock signal back from the memory, monitors the duty cycle of the clock signal received back from the memory, and in response to the duty cycle of the clock signal received back from the memory not meeting a target value, adjusts the duty cycle of the clock signal provided to the memory so that the duty cycle of the clock signal received back from the memory better meets the target value. Other embodiments are possible, and each of the embodiments can be used alone or together in combination.

21 Claims, 11 Drawing Sheets

STORAGE SYSTEM AND METHOD FOR DYNAMIC DUTY CYCLE CORRECTION

BACKGROUND

Various interfaces can be used to communicate between a controller and a memory of a storage system. One such interface is the Toggle Mode Double Data Rate (DDR) interface. Toggle Mode DDR works by generating input/output (I/O) signals applied on the write enable and read enable inputs on both the rising and the falling edge of a clock signal provided to the memory by the controller. To provide a desired margin of signal integrity and data transfer performance, some controllers are designed to provide a clock signal with a duty cycle at or near 50%. However, due to various distortions in the clock signal path, the duty cycle of the clock signal may be altered. To address this, simulations can be run during the design phase with models of the controller and the clock signal path to determine the parasitics that introduce duty cycle distortion. Based on the simulations, optimum drive strengths of input-output ("IO") drivers can be selected and different duty cycle distortion budgets can be assigned to different components in the clock signal path.

DETAILED DESCRIPTION

Overview

Figure 1A:
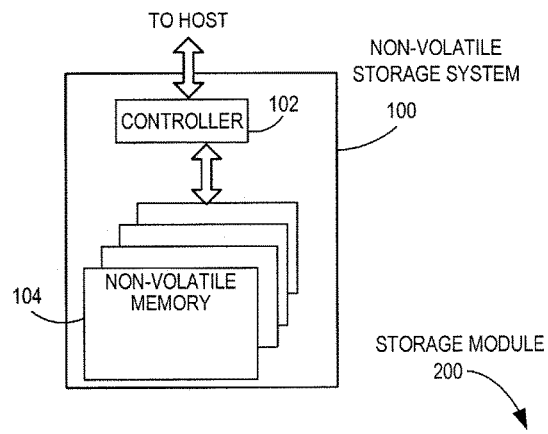
FIG. 1A is a block diagram of a non-volatile storage system of an embodiment.

By way of introduction, the below embodiments relate to a storage system and method for dynamic duty cycle correction. In one embodiment, a method for dynamic duty cycle correction is provided that is performed in a controller of a storage system that comprises a memory. This method comprises providing a clock signal to the memory, wherein the clock signal provided to the memory has a duty cycle; receiving the clock signal back from the memory; monitoring the duty cycle of the clock signal received back from the memory; and in response to the duty cycle of the clock signal received back from the memory not meeting a target value, adjusting the duty cycle of the clock signal provided to the memory so that the duty cycle of the clock signal received back from the memory better meets the target value.

In some embodiments, the clock signal is provided to the memory and is received back from the memory during a read operation.

In some embodiments, the duty cycle is monitored by a duty cycle monitor in the controller.

In some embodiments, control logic in the controller determines whether the duty cycle of the clock signal received back from the memory meets the target value.

In some embodiments, the duty cycle is adjusted by a duty cycle control circuit in the controller.

In some embodiments, the memory comprises a three-dimensional memory.

In some embodiments, the storage system is embedded in a host.

In some embodiments, the storage system is removably connected to a host.

In another embodiment, a storage system is provided comprising a memory and a controller. The controller is configured to provide a clock signal to the memory, wherein the clock signal provided to the memory has a duty cycle. The memory comprises a duty cycle monitor configured to determine the duty cycle of the clock signal received from the controller and send information about the determined duty cycle to the controller. The controller comprises a duty cycle control circuit configured to alter the duty cycle of the clock signal provided to the memory if the information about the determined duty cycle indicates that the determined duty cycle is sufficiently different from the duty cycle of the clock signal provided to the memory.

In some embodiments, the duty cycle monitor is configured to determine the duty cycle of the clock signal received from the controller during a write operation and send information about the determined duty cycle to the controller during a subsequent read operation.

In some embodiments, the memory comprises a three-dimensional memory.

In some embodiments, the storage system is embedded in a host.

In some embodiments, the storage system is removably connected to a host.

In another embodiment, a storage system is provided comprising a memory; means for providing a clock signal to the memory, wherein the clock signal has a duty cycle, and wherein distortion in the storage system causes the duty cycle of the clock signal to be altered; means for determining whether the distortion causes the duty cycle of the clock signal to be altered beyond a threshold; and means for changing the duty cycle of the clock signal provided to the memory to be within the threshold.

In some embodiments, the means for providing comprises a controller having a clock source.

In some embodiments, the means for determining comprises a duty cycle monitor in the memory and control logic in a controller in communication with the memory.

In some embodiments, the means for determining comprises a duty cycle monitor and control logic in a controller in communication with the memory.

In some embodiments, the means for changing comprises a duty cycle control circuit in a controller in communication with the memory.

In some embodiments, the memory comprises a three-dimensional memory.

In some embodiments, the storage system is embedded in a host.

In some embodiments, the storage system is removably connected to a host.

Other embodiments are possible, and each of the embodiments can be used alone or together in combination. Accordingly, various embodiments will now be described with reference to the attached drawings.

Exemplary Embodiments

Figure 1B:
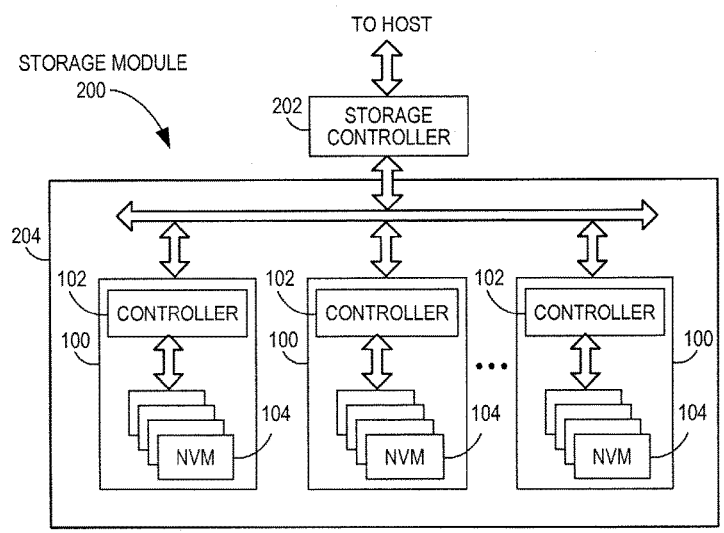
FIG. 1B is a block diagram illustrating an exemplary storage module of an embodiment.
Figure 1C:
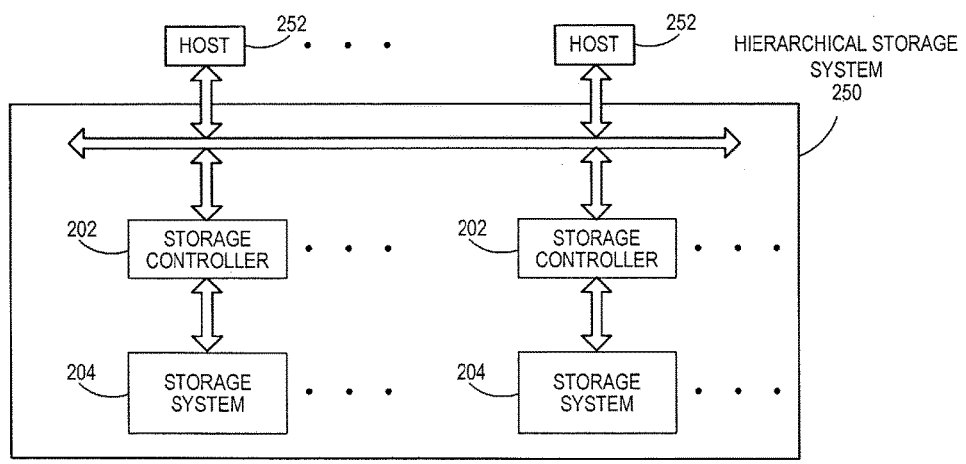
FIG. 1C is a block diagram illustrating a hierarchical storage system of an embodiment.

Storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some NAND storage system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
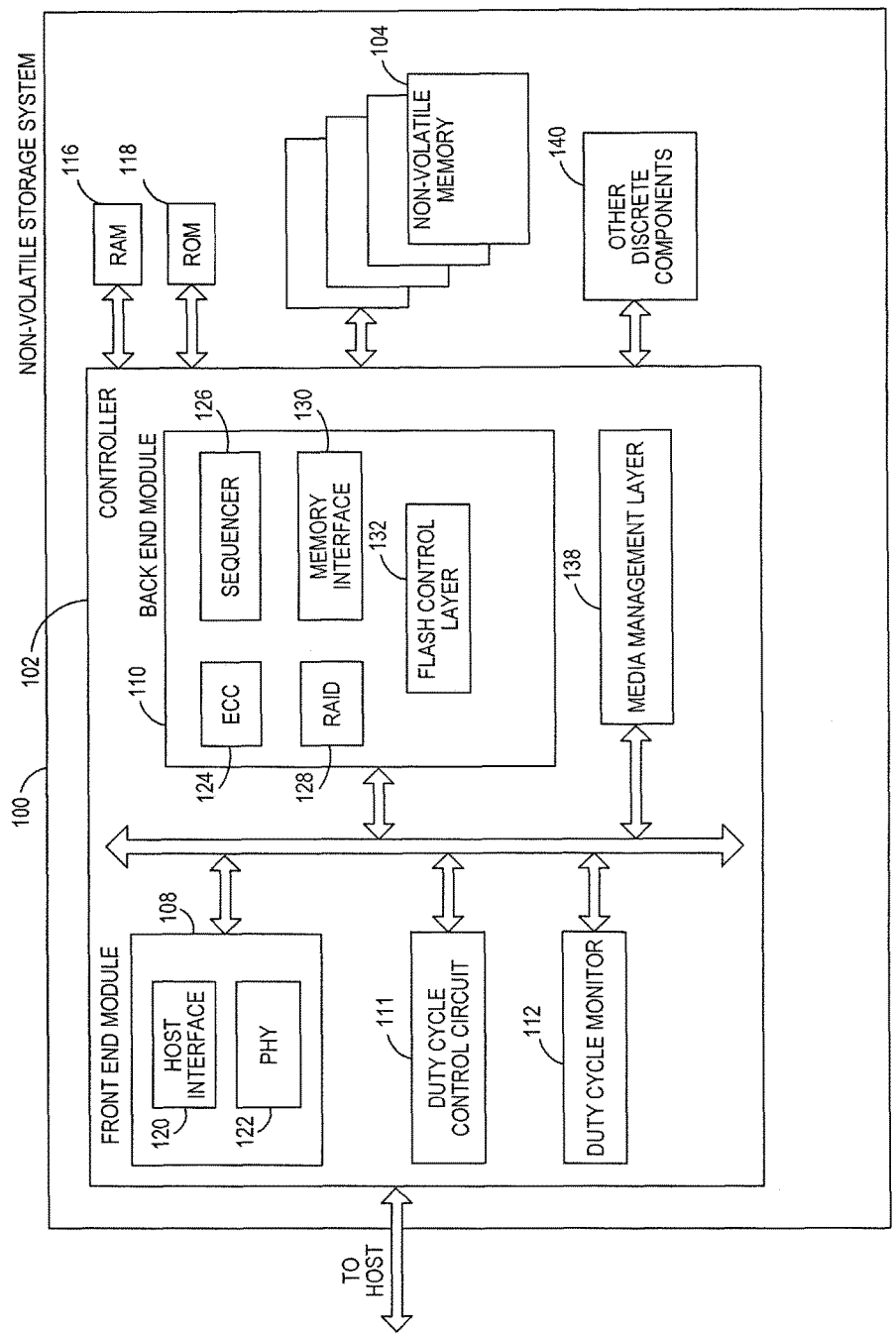
FIG. 2A is a block diagram illustrating exemplary components of the controller of the non-volatile storage system illustrated in FIG. 1A according to an embodiment.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. Modules of the controller 102 may include a duty cycle control circuit 111 is configured to adjust the duty cycle of the clock signal provided to the memory 104 and a duty cycle monitor 112 configured to monitor the duty cycle of the clock signal returned from the memory 104. Implementation of the functionality of these modules will be discussed in more detail below. It should be noted, though, that a module, circuit, or monitor may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

A buffer manager/bus controller (not shown) manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, SD, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
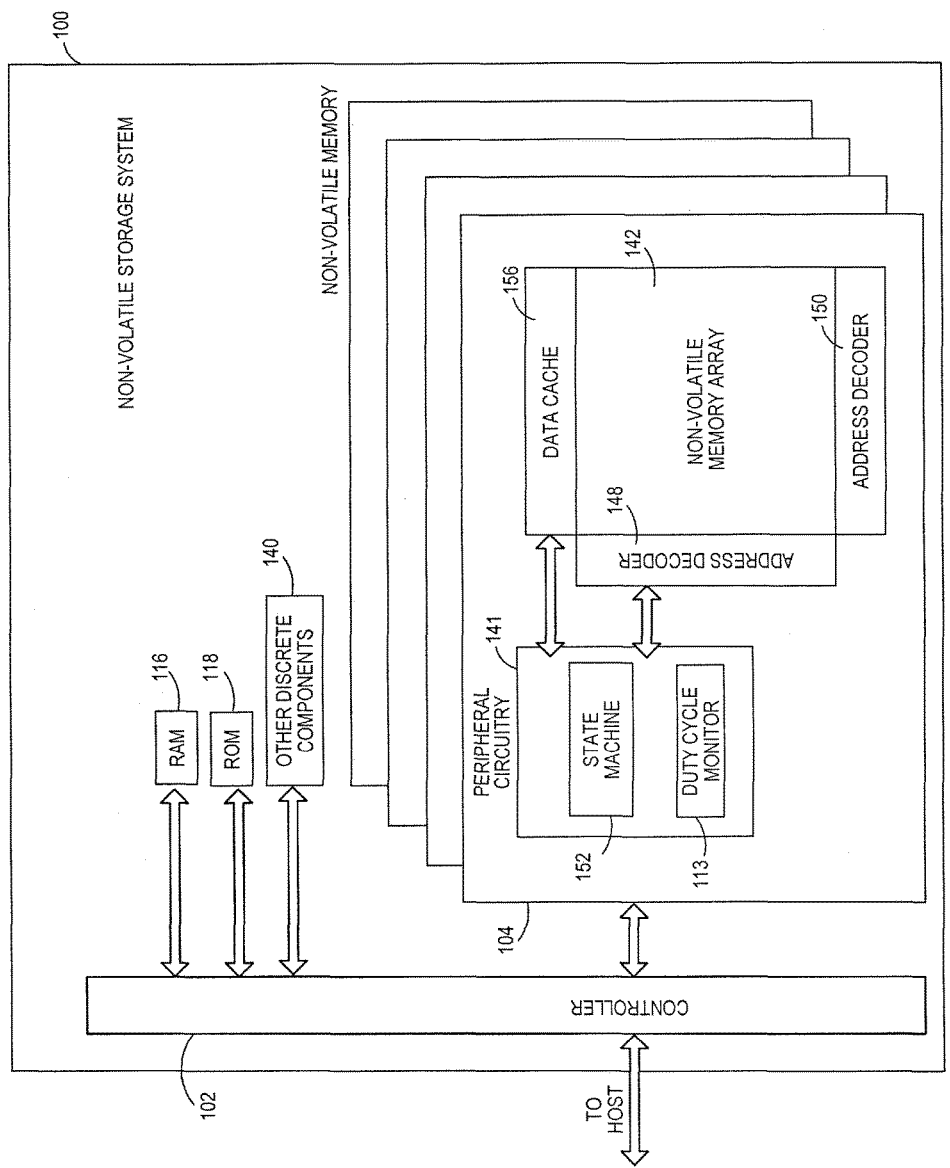
FIG. 2B is a block diagram illustrating exemplary components of the non-volatile memory storage system illustrated in FIG. 1A according to an embodiment.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102 and a duty cycle monitor 113, which will be discussed in more detail below.

As discussed above, various interfaces can be used to communicate between the controller 102 and the memory 104. One such interface is the Toggle Mode Double Data Rate (DDR) interface. Toggle Mode DDR works by generating input/output (I/O) signals applied on the write enable and read enable inputs on both the rising and the falling edge of a clock signal provided to the memory 104 by the controller 102. Of course, other interfaces (e.g., those that use the rising and the falling edge of the clock signal, as well as those that do not) can be used, and Toggle Mode DDR should not be read into the claims unless expressly recited therein.

In one embodiment, to provide a desired margin of signal integrity and a desired data transfer performance, the controller 102 is designed to provide a clock signal with a duty cycle at or near 50%. As used herein, "duty cycle" refers to the percentage of one period in which the clock signal is active, and a period is the time it takes for the clock signal to complete an on-and-off cycle. So, a clock signal with a duty cycle of 50% means that the clock signal is on for 50% of the time and off for 50% of the time. However, due to various distortions in the clock signal path, the duty cycle of the clock signal at the time it is used by the memory 104 may not have the desired duty cycle.

Consider, for example, a read operation, in which the controller 102 provides a clock signal to the memory chip 104, and the memory chip 104 sends back this clock signal along with the read data. In this path/loop, the clock signal passes through the controller's clock tree, the controller's IO, the memory chip's clock path, memory chip's IO, and substrate/board's signal paths. Similarly, for a write operation where the controller 102 provides the clock signal to the memory chip 104 along with the data to be written, the clock signal goes through the controller's clock tree, the controller's IO, the memory chip IO, the memory chip's clock path, and the substrate/board's signal paths.

All these components affect the clock signal and introduce duty cycle distortion (DCD), which eventually reduces the margin of signal integrity and thus reduces data transfer performance. This DCD has two components: random distortion and static/systematic distortion. Random DCD depends on the noise immunity of different components of the clock path. Static/systematic DCD usually happens due to component mismatches, asymmetrical design, and voltage and temperature variations. Static DCD usually varies slowly over voltage and temperature variation.

The following embodiments provide a feedback loop in the storage system 100 to dynamically correct duty cycle distortions (e.g., static/systematic DCD). The embodiment can be used one or more times during product testing or can be used dynamically when the storage system 100 is in use.

Figure 3:
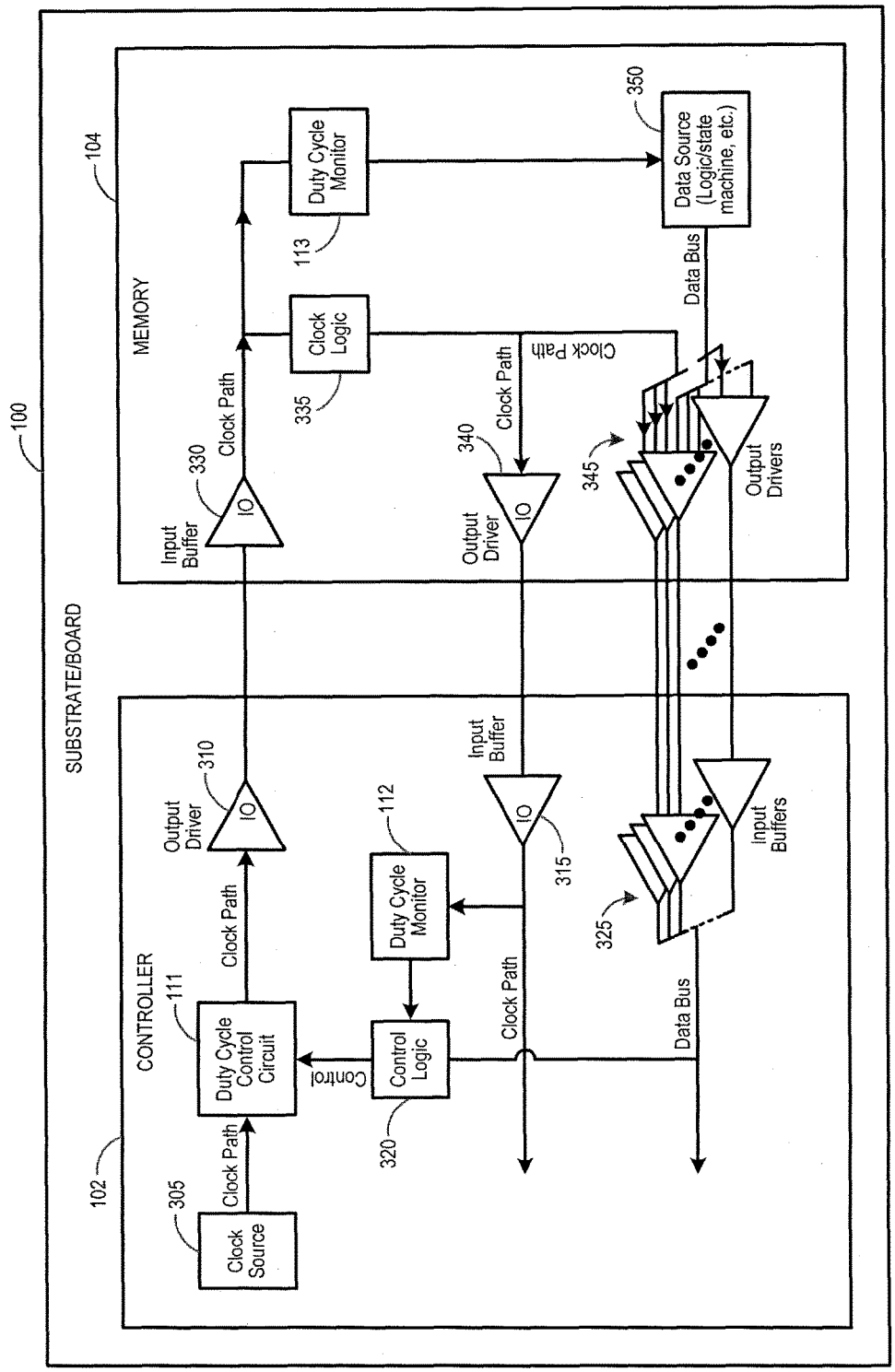
FIG. 3 is an illustration of a storage system of an embodiment.

Turning again to the drawings, FIG. 3 is an illustration of additional components of the storage system 100 that can be used with this embodiment. As shown in FIG. 3, the controller 102 comprises outgoing and incoming clock signal paths, as well as a data bus that can transfer data to/from the memory 104. The outgoing clock signal path comprises a clock source 305 (e.g., an oscillator or phase-locked loop ("PLL")), a duty cycle control circuit 111, and an output driver 310. As will be discussed in more detail below, the duty cycle control circuit 111 is configured to adjust the duty cycle of the clock signal provided to the memory 104. The incoming clock signal path comprises an input buffer 315, which is connected to a duty cycle monitor 112, which monitors the duty cycle of the clock signal returned from the memory 102. The duty cycle monitor 112 is connected to control logic 320 (e.g., a microcontroller or a state machine) that sends control signals to the duty cycle control circuit 111. Although shown as separate components in FIG. 3, in another embodiment, the control logic 320 can be part of the duty cycle control circuit 111. The data bus comprises input buffers 325 which store data received from the memory 104 in a read operation. Although not shown in FIG. 3 to simplify the drawing, the controller 102 can also comprise output drivers to provide data to the memory 102 in a write operation.

Turning now to the memory 104, the clock signal path comprises an input buffer 330, which provides the clock signal to clock logic 335, which, in turn, provides the clock signal to an output driver 340 (to return the clock signal to the controller 104 during a read operation) and output drivers 345 to control the flow of data sent from the memory array (part of the "data source" 350). In this embodiment, the memory 104 also comprises a duty cycle monitor 113, which can monitor the duty cycle of the clock signal sent from the controller 102.

It should be noted that not all of the components shown in FIG. 3 may be needed in various embodiments. For example, as discussed in more detail below, the duty cycle monitor 113 in the memory 104 may not be needed when the storage system 100 performs dynamic duty cycle correction during a read operation.

Figure 4:
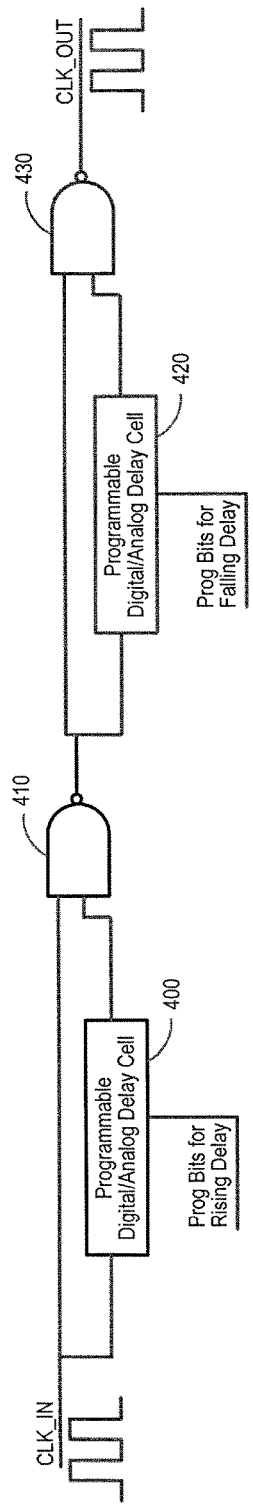
FIG. 4 is an illustration of a duty cycle control circuit of an embodiment.
Figure 5:
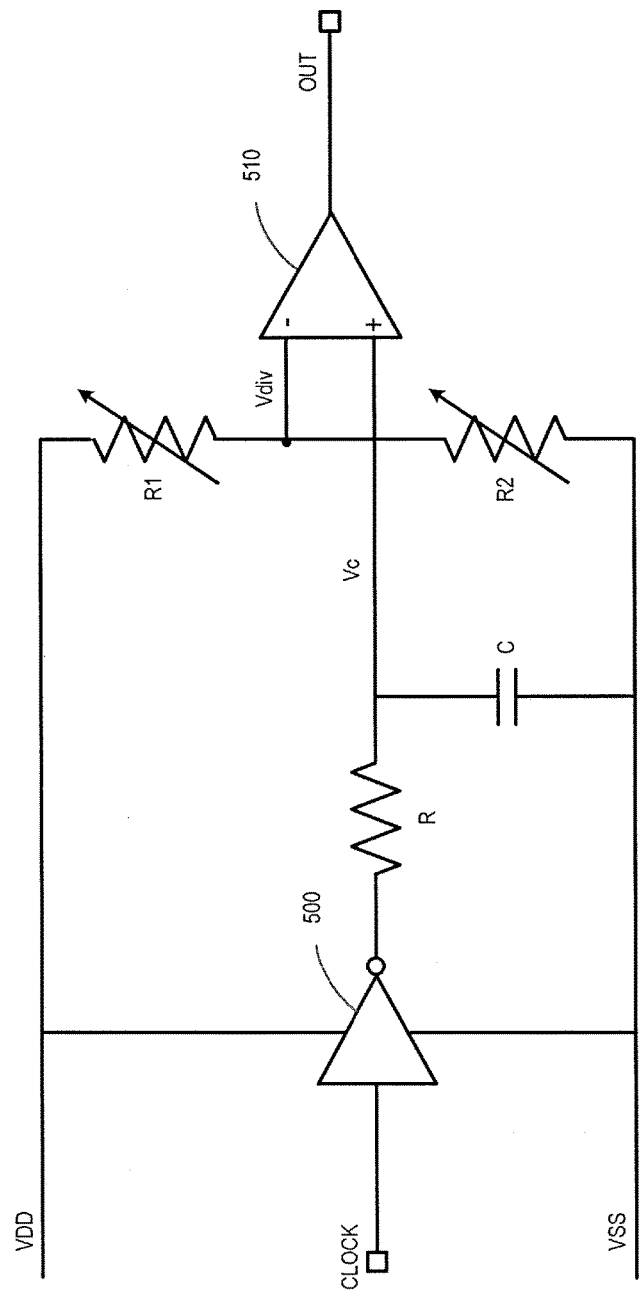
FIG. 5 is an illustration of an analog implementation of a duty cycle monitor of an embodiment.
Figure 6:
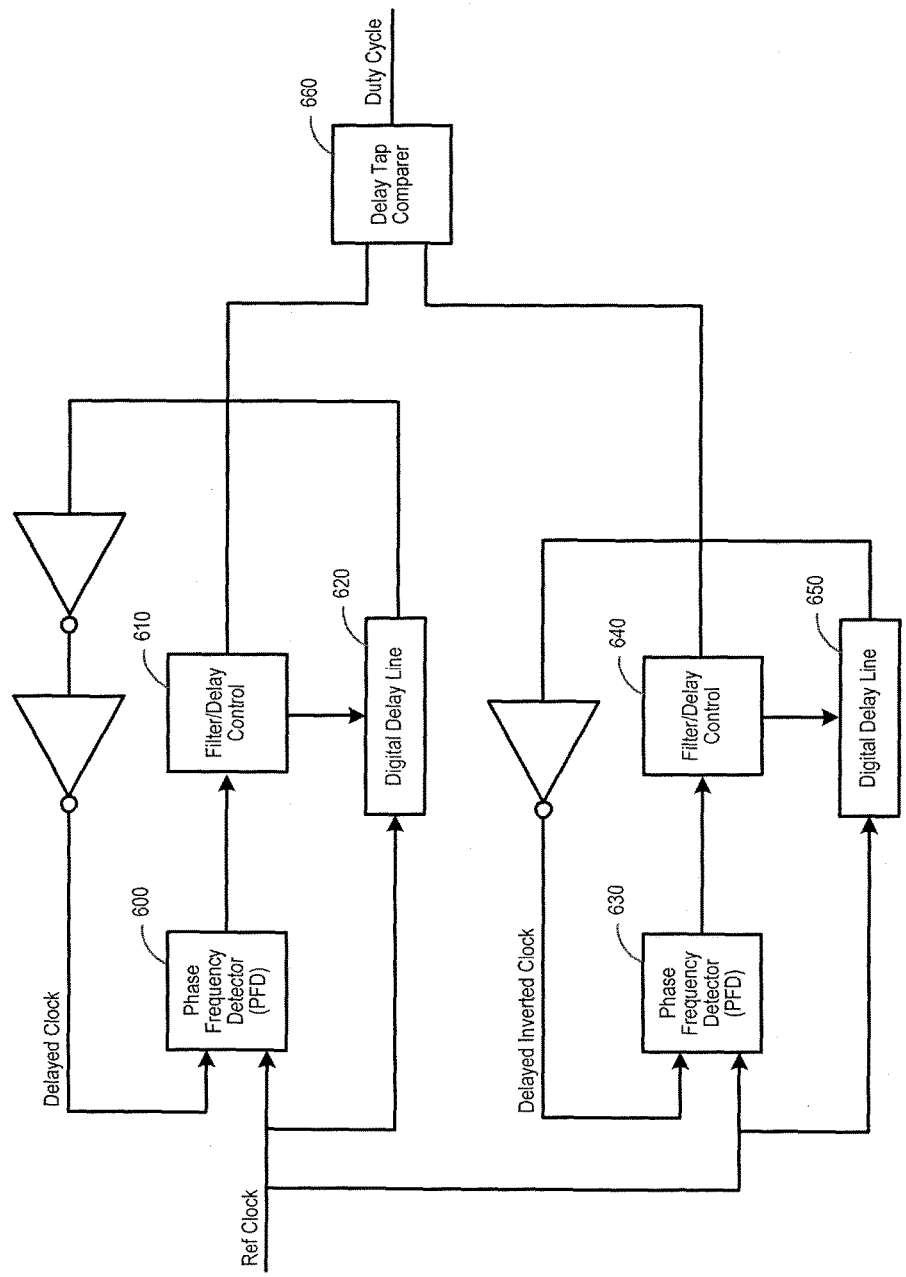
FIG. 6 is an illustration of a digital implementation of a duty cycle monitor of an embodiment.

Before turning to the operation of the duty cycle control circuit 111 and the duty cycle monitors 112, 113, FIGS. 4-6 provide illustrations of exemplary implementations of these components. Of course, these are merely examples, and other implementations can be used.

Turning first to FIG. 4, FIG. 4 is an illustration of an exemplary implementation of a duty cycle control circuit 111 of an embodiment. As shown in FIG. 4, in this embodiment, the duty cycle control circuit 111 comprises a first programmable digital/analog delay cell 400, a first NAND gate 410, a second programmable digital/analog delay cell 420, and a second NAND gate 430. With these components, the duty cycle control circuit 111 can adjust the duty cycle of the clock signal provided to the memory 104. In operation, the control logic 320 (which, as mentioned above, can be part of or separate from the duty cycle control circuit 111) can provide programming bits to the first programmable digital/analog delay cell 400 in order to delay the rising edge of the clock signal. Similarly, the control logic 320 can provide programming bits to the second programmable digital/analog delay cell 420 in order to delay the falling edge of the clock signal.

As will be discussed in detail below, the control logic 320 determines what programming bits to provide to the duty cycle control circuit 111 based on the output of the duty cycle monitor 112, 113. FIG. 5 is an illustration of an analog implementation of the duty cycle monitor 112, 113, and FIG. 6 is an illustration of a digital implementation of the duty cycle monitor 112, 113.

Turning first to FIG. 5, an inverter 500 inverts the clock signal and provides the inverted clock signal into the low-pass filter formed by the resistor R and capacitor C. This provides a voltage Vc that is supplied to the positive input of a comparator 510. Vdiv is trimmed with variable resistors R1 and R2 and supplied in the negative input of a comparator 510. In operation, the clock input goes to the inverter 500, which drive the RC circuit. If the clock input is 50% duty cycle, the average value of the inverter output will be half of VDD (because half of the time, the signal is high; and the other half of the time, the signal is low). The RC circuit acts as a low-pass filter, so, over time, Vc should be half of VDD if 50% duty cycle. If R1=R2, the Vdiv would also be half of VDD. So, by comparing Vdiv with Vc, the comparator 510 can check to see whether the clock is 50% duty cycle. R1 and R2 can be trimmed, in which case the comparator 510 can check to see whether the clock is at some other desired duty cycle (e.g., 48%).

Turning now to the digital implementation in FIG. 6, the duty cycle monitor circuit 112, 113 of this embodiment comprises a first phase frequency detector (PFD) 600, a first filter/delay control 610, a first digital delay line 620, a second phase frequency detector (PFD) 600, a second filter/delay control 610, a second digital delay line 620, and a delay tap comparer 660. The comparison operation is similar to what is discussed above but with a digital implementation.

With the components of the storage system 100 now described, the following paragraphs will discuss how these components can act as a feedback loop to dynamically correct duty cycle distortions (e.g., static/systematic DCD). In general, the distortion in the storage system 100 can cause the duty cycle of the clock signal provided from the controller 102 to the memory 104 to be altered. If the storage system 100 determines that the distortion causes the duty cycle of the clock signal to be altered beyond a threshold, the storage system 100 can change the duty cycle of the clock signal provided to the memory 104 to account for that alteration. This method of dynamic duty cycle correction can occur during a read and/or write operation, but each of these operations account for different distortions. Each of these operations will now be described.

Figure 7:
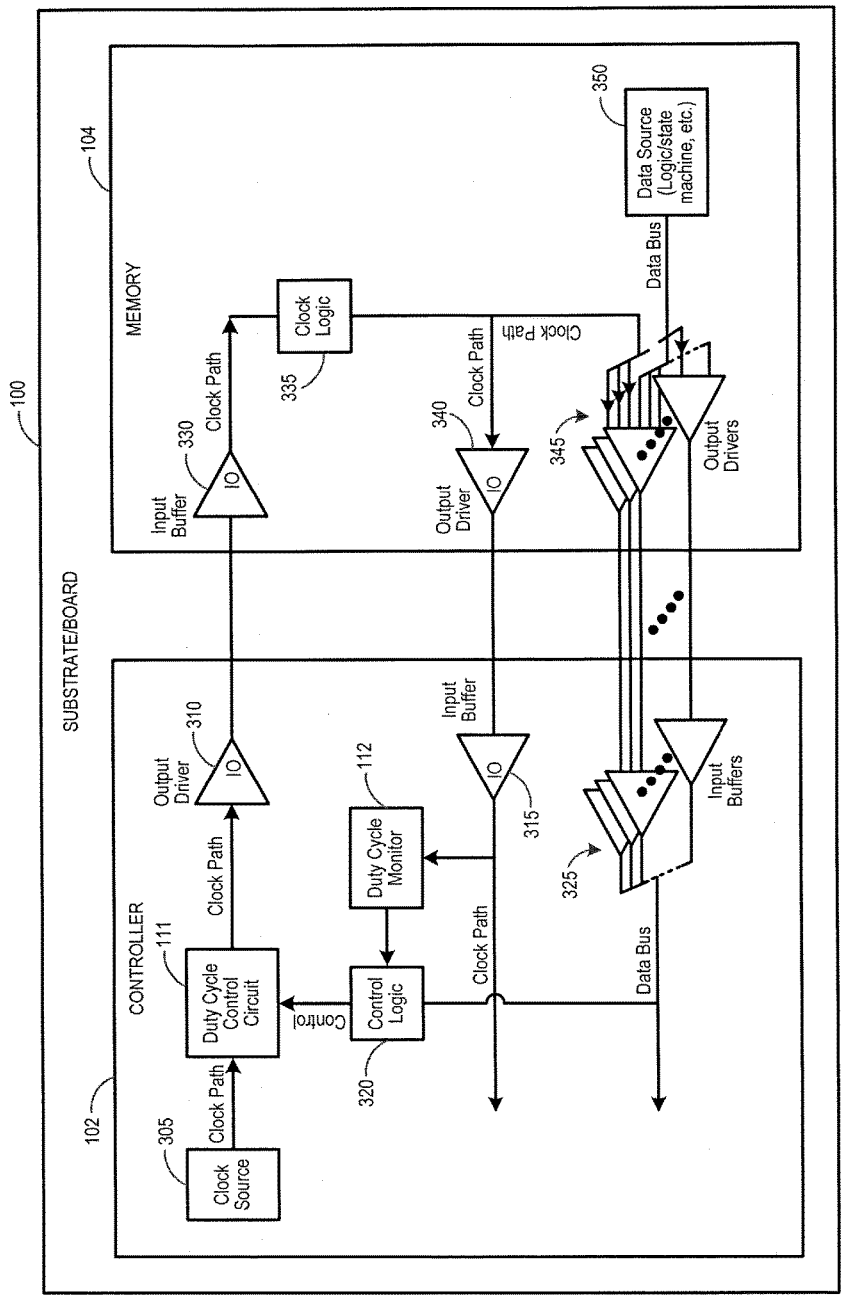
FIG. 7 is an illustration of a storage system of an embodiment showing components that can be used to dynamically correct duty cycle during a read operation.
Figure 8:
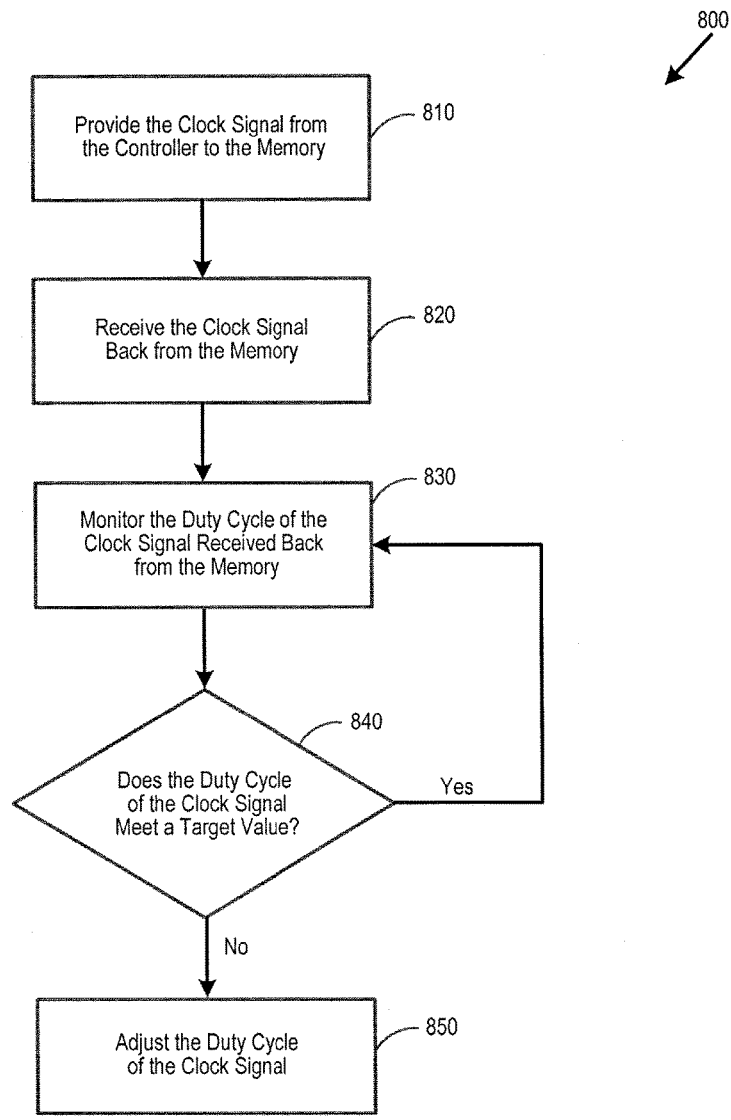
FIG. 8 is a flow chart of a method of an embodiment for dynamically correcting duty cycle during a read operation.

When performing dynamic duty cycle correction during a read operation, the duty cycle monitor 113 in the memory 104 is not needed, and FIG. 7 shows the storage system 100 of FIG. 3 without that monitor 113. As shown in the flow chart 800 in FIG. 8, in operation, the clock signal is provided from the controller 102 to the memory 104 (act 810). Specifically, in this embodiment, the clock signal generated by the clock source 305 passes through the duty cycle control circuit 111 and then goes to the memory chip 104 through the clock IO 310 in the controller 102.

The clock signal is used in the memory 104 to control its output drivers 345 to provide the controller 102 with data read out of the memory array. The clock signal is also send back to the controller on a return clock signal path (act 820), and the controller 102 monitors the duty cycle of the clock signal received back from the memory 104 (act 830). The controller 102 then determines if the duty cycle of the clock signal returned from the memory 104 meets a target value (act 840). In this embodiment, the clock signal coming back from memory chip 104 is continuously monitored by the duty cycle monitor ("DCM") 112. The duty cycle monitor 112 will monitor if clock duty cycle meets some threshold or target range (e.g., close to 50% or within some pre-defined range (for example, +/−1%)).

If the duty cycle meets the target value, the controller 102 continues to monitor the duty cycle for variations. However, if the duty cycle does not meet the target value, the controller 102 adjusts the duty cycle of the clock signal provided to the memory 104 so that the duty cycle of the clock signal returned from the memory 104 better meets the target value (act 850). In this embodiment, the duty cycle monitor 111 provides its results to control logic 320, which programs/trims the duty cycle control circuit 111 to correct the overall duty cycle of the clock signal, thereby correct for the duty cycle distortions.

Figure 9:
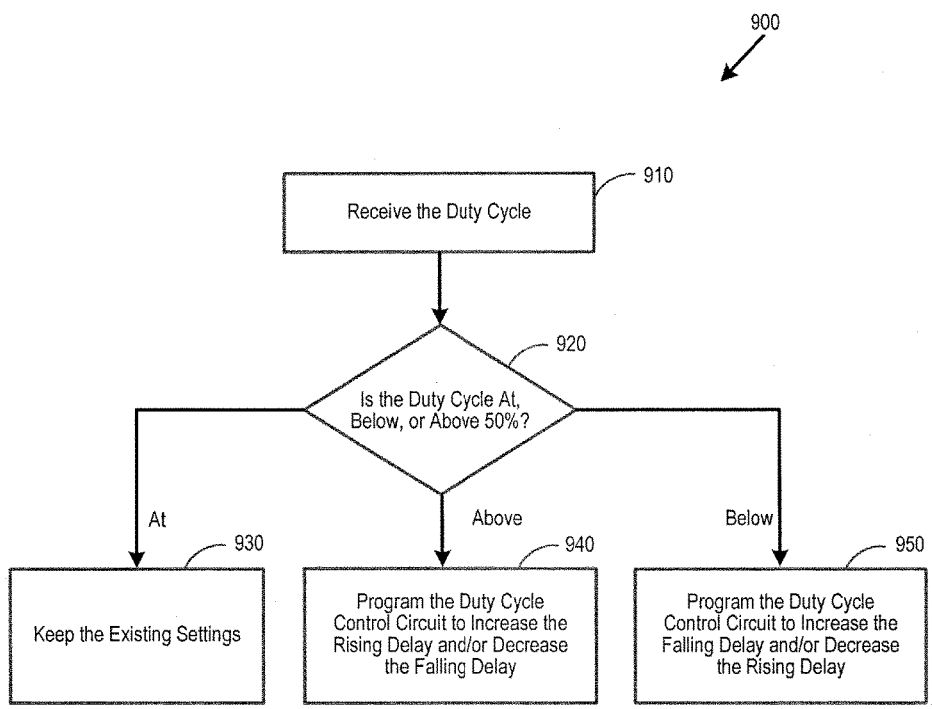
FIG. 9 is a flow chart illustrating the operation of control logic in an embodiment.

FIG. 9 is a flow chart 900 illustrating the operation of the control logic 320 in one embodiment. As shown in FIG. 9, the control logic 320 receives the duty cycle (act 910) and determines if it is at, below, or above 50% (act 920). If the duty cycle is at 50%, the control logic 320 keeps the existing settings (act 930). If the duty cycle is above 50%, the control logic 320 programs the duty cycle control circuit 111 to increase the rising delay and/or decrease the falling delay (act 940). If the duty cycle is below 50%, the control logic 320 programs the duty cycle control circuit 111 to increase the falling delay and/or decrease the rising delay (act 950). Of course, these values are just examples. So, instead of 50% being the desired duty cycle, a different percentage can be used or a range can be used (e.g., 49-51%), such that duty cycle control circuit 111 takes action only if the duty cycle is sufficiently different from a certain value or range.

Figure 10:
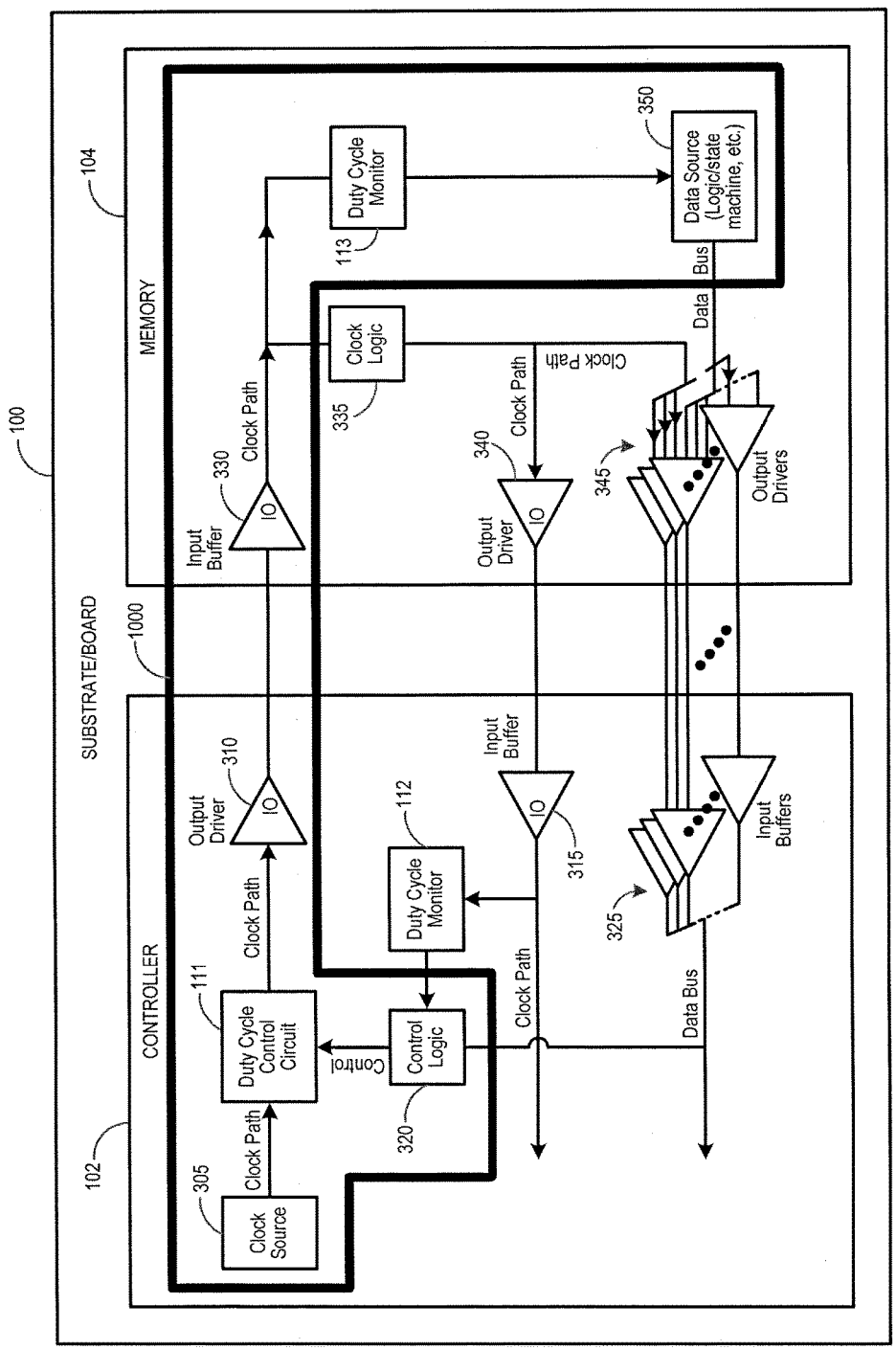
FIG. 10 is an illustration of a storage system of an embodiment showing components that can be used to dynamically correct duty cycle during a write operation.

When performing dynamic duty cycle correction during a write operation, the duty cycle monitor 113 in the memory 104 can be used as part of a two-step operation. FIG. 10 highlights the path 1000 used in the first step.

In step one, which takes place during the write operation, the clock signal is provided from the controller 102 to the memory 104. Specifically, in this embodiment, the clock signal generated by the clock source 305 passes through the duty cycle control circuit 111 and then goes to the memory chip 104 through the clock IO 310 in the controller 102. The duty cycle monitor 113 in the memory 104 monitors the duty cycle of the clock signal and generates a duty cycle value, which it saves in the data source 350 in the memory.

In step two, which takes place during a subsequent read operation, the controller 102 communicates with the memory chip 104 to collect the duty cycle information stored in the data source 350. In this embodiment, this information is provided as data delivered to the controller 102 on the data bus. The control logic 320 in the controller 102 interprets this information and programs the duty cycle control circuit 111 accordingly to correct the duty cycle. It should be noted that it is possible to start the clock with a lower speed for duty cycle correction, and after the correction, the clock can run with full speed. In this way, even if there is distortion, the storage system 100 can still transfer data.

There are many advantages associated with these embodiments. For example, the embodiments can be used to correct overall systematic duty cycle distortions of the clock signal inside the controller 102, substrate/board, and memory chip 104. Correcting for these distortions can increase the interface performance, as well as reduce design and verification time, which can be beneficial for interfaces, such as Toggle Mode DDR. Also, these embodiments can improve the margin for signal integrity, so performance throughput can be improved. This may reduce design and verification effort and time. Further, the duty-cycle-distortion correcting loop can operate in low speed to only correct average duty cycle distortion. In this way, the duty cycle control circuit 111 can compensate for systematic (e.g., due to design error, process mismatch, parasitics, etc.) and voltage & temperature dependent duty cycle distortions.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method comprising:
    performing the following in a controller of a storage system, wherein the storage system also comprises a non-volatile memory:
       providing a clock signal to the non-volatile memory, the clock signal having a duty cycle;
       receiving the clock signal back from the non-volatile memory;
       monitoring the duty cycle of the clock signal received back from the non-volatile memory; and
       in response to the duty cycle of the clock signal received back from the non-volatile memory not meeting a target value, adjusting the duty cycle of the clock signal provided to the non-volatile memory so that the duty cycle of the clock signal received back from the non-volatile memory better meets the target value;
       wherein the duty cycle of the clock signal received back from the non-volatile memory is distorted as the clock signal travels from an input into the memory to an output out of the non-volatile memory.

2. The method of claim 1, wherein the clock signal is provided to the non-volatile memory and is received back from the non-volatile memory during a read operation.

3. The method of claim 1, wherein the duty cycle is monitored by a duty cycle monitor in the controller.

4. The method of claim 1, wherein control logic in the controller determines whether the duty cycle of the clock signal received back from the non-volatile memory meets the target value.

5. The method of claim 1, wherein the duty cycle is adjusted by a duty cycle control circuit in the controller.

6. The method of claim 1, wherein the non-volatile memory comprises a three-dimensional non-volatile memory.

7. The method of claim 1, wherein the storage system is embedded in a host.

8. The method of claim 1, wherein the storage system is removably connected to a host.

9. A storage system comprising:
    a non-volatile memory; and
    a controller in communication with the non-volatile memory, wherein the controller is configured to provide a clock signal to the non-volatile memory, the clock signal having a duty cycle;
    wherein the non-volatile memory comprises a duty cycle monitor configured to determine the duty cycle of the clock signal received from the controller and send information about the determined duty cycle to the controller; and
    wherein the controller comprises a duty cycle control circuit configured to alter the duty cycle of the clock signal provided to the non-volatile memory if the information about the determined duty cycle indicates that the determined duty cycle is sufficiently different from the duty cycle of the clock signal provided to the non-volatile memory;
    wherein the duty cycle of the clock signal is distorted as the clock signal travels from an input into the non-volatile memory to the duty cycle monitor.

10. The storage system of claim 9, wherein the duty cycle monitor is configured to determine the duty cycle of the clock signal received from the controller during a write operation and send information about the determined duty cycle to the controller during a subsequent read operation.

11. The storage system of claim 9, wherein the non-volatile memory comprises a three-dimensional non-volatile memory.

12. The storage system of claim 9, wherein the storage system is embedded in a host.

13. The storage system of claim 9, wherein the storage system is removably connected to a host.

14. A storage system comprising:
a non-volatile memory;
means for providing a clock signal to the non-volatile memory, the clock signal having a duty cycle, wherein distortion in the storage system causes the duty cycle of the clock signal to be altered;
means for determining whether the distortion causes the duty cycle of the clock signal to be altered beyond a threshold; and
means for changing the duty cycle of the clock signal provided to the non-volatile memory to be within the threshold;
wherein the duty cycle of the clock signal is distorted as the clock signal travels from an input into the non-volatile memory to an output out of the non-volatile memory.

15. The storage system of claim 14, wherein the means for providing comprises a controller having a clock source.

16. The storage system of claim 14, wherein the means for determining comprises a duty cycle monitor in the non-volatile memory and control logic in a controller in communication with the non-volatile memory.

17. The storage system of claim 14, wherein the means for determining comprises a duty cycle monitor and control logic in a controller in communication with the non-volatile memory.

18. The storage system of claim 14, wherein the means for changing comprises a duty cycle control circuit in a controller in communication with the non-volatile memory.

19. The storage system of claim 14, wherein the non-volatile memory comprises a three-dimensional non-volatile memory.

20. The storage system of claim 14, wherein the storage system is embedded in a host.

21. The storage system of claim 14, wherein the storage system is removably connected to a host.

\* \* \* \* \*